(12) United States Patent
Moustakas et al.

(10) Patent No.: US 7,777,241 B2
(45) Date of Patent: Aug. 17, 2010

(54) OPTICAL DEVICES FEATURING TEXTURED SEMICONDUCTOR LAYERS

(75) Inventors: Theodore D. Moustakas, Dover, MA (US); Jasper S. Cabalu, Allston, MA (US)

(73) Assignee: The Trustees of Boston University, Boston, MA (US)

( * ) Notice: Subject to any disclaimer, the term of this patent is extended or adjusted under 35 U.S.C. 154(b) by 0 days.

(21) Appl. No.: 11/107,150

(22) Filed: Apr. 15, 2005

(65) Prior Publication Data

US 2005/0242364 A1 Nov. 3, 2005

Related U.S. Application Data

(60) Provisional application No. 60/562,489, filed on Apr. 15, 2004, provisional application No. 60/615,047, filed on Oct. 1, 2004, provisional application No. 60/645,704, filed on Jan. 21, 2005.

(51) Int. Cl.
*H01L 33/22* (2010.01)

(52) U.S. Cl. .......... 257/95; 257/E33.008; 257/E33.023; 438/42; 438/71; 438/665

(58) Field of Classification Search .................. 438/22, 438/223–228, 42, 71, 665; 257/9, 14, 85, 257/90, 94, 95, 102, 103, E33.008, E33.023
See application file for complete search history.

(56) References Cited

U.S. PATENT DOCUMENTS

| | | | | |
|---|---|---|---|---|
| 4,147,564 A | * | 4/1979 | Magee et al. | 438/20 |
| 4,342,944 A | | 8/1982 | SpringThorpe | 313/499 |
| 4,664,748 A | * | 5/1987 | Ueno et al. | 216/51 |
| 5,040,044 A | | 8/1991 | Noguchi et al. | 357/52 |
| 5,248,621 A | * | 9/1993 | Sano | 438/64 |

(Continued)

FOREIGN PATENT DOCUMENTS

JP 60173829 9/1985

(Continued)

OTHER PUBLICATIONS

H.W. Deckman et al; Molecular-Scale Microporous Superlattices; MRS Bulletin, 1987, pp. 24-26.

(Continued)

*Primary Examiner*—David Vu
*Assistant Examiner*—Earl N Taylor
(74) *Attorney, Agent, or Firm*—Weingarten, Schurgin, Gagnebin & Lebovici LLP

(57) ABSTRACT

A semiconductor sensor, solar cell or emitter or a precursor therefore having a substrate and textured semiconductor layer deposited onto the substrate. The layer can be textured as grown on the substrate or textured by replicating a textured substrate surface. The substrate or first layer is then a template for growing and texturing other semiconductor layers from the device. The textured layers are replicated to the surface from the substrate to enhance light extraction or light absorption. Multiple quantum wells, comprising several barrier and quantum well layers, are deposited as alternating textured layers. The texturing in the region of the quantum well layers greatly enhances internal quantum efficiency if the semiconductor is polar and the quantum wells are grown along the polar direction. This is the case in nitride semiconductors grown along the polar [0001] or [000-1] directions.

72 Claims, 12 Drawing Sheets

U.S. PATENT DOCUMENTS

| | | | |
|---|---|---|---|
| 5,309,001 A | 5/1994 | Watanabe et al. ............. 257/99 |
| 5,456,762 A | 10/1995 | Kariya et al. |
| 5,684,309 A * | 11/1997 | McIntosh et al. ............. 257/191 |
| 5,779,924 A | 7/1998 | Krames et al. ................. 216/24 |
| 5,814,839 A * | 9/1998 | Hosoba ........................ 257/96 |
| 5,891,264 A * | 4/1999 | Shinohara et al. ........... 136/261 |
| 5,977,477 A * | 11/1999 | Shiozaki ..................... 136/256 |
| 5,986,204 A * | 11/1999 | Iwasaki et al. ............... 136/256 |
| 5,990,496 A * | 11/1999 | Kunisato et al. .............. 257/94 |
| 6,091,083 A * | 7/2000 | Hata et al. ..................... 257/79 |
| 6,099,970 A * | 8/2000 | Bruno et al. ................. 428/432 |
| 6,133,589 A | 10/2000 | Krames et al. ............. 257/103 |
| 6,163,038 A | 12/2000 | Chen et al. |
| 6,229,151 B1 | 5/2001 | Takeuchi et al. |
| 6,252,261 B1 | 6/2001 | Usui et al. |
| 6,258,618 B1 | 7/2001 | Lester .......................... 438/46 |
| 6,285,698 B1 * | 9/2001 | Romano et al. .......... 372/46.01 |
| 6,291,839 B1 | 9/2001 | Lester .......................... 257/91 |
| 6,294,440 B1 | 9/2001 | Tsuda et al. |
| 6,328,456 B1 | 12/2001 | Mize ........................... 362/311 |
| 6,376,864 B1 | 4/2002 | Wang ........................... 257/98 |
| 6,468,347 B1 * | 10/2002 | Motoki et al. .................. 117/89 |
| 6,469,324 B1 | 10/2002 | Wang ........................... 257/98 |
| 6,486,499 B1 | 11/2002 | Krames et al. ................. 257/81 |
| 6,495,862 B1 | 12/2002 | Okazaki et al. ............. 257/103 |
| 6,518,598 B1 | 2/2003 | Chen ........................... 257/91 |
| 6,534,336 B1 * | 3/2003 | Iwane et al. ................... 438/71 |
| 6,628,249 B1 | 9/2003 | Kamikawa et al. |
| 6,649,943 B2 | 11/2003 | Shibata et al. |
| 6,733,591 B2 | 5/2004 | Anderson |
| 6,870,191 B2 | 3/2005 | Niki et al. |
| 2001/0000209 A1 | 4/2001 | Krames et al. ................. 257/94 |
| 2002/0046693 A1 * | 4/2002 | Kiyoku et al. .................. 117/8 |
| 2002/0070386 A1 | 6/2002 | Krames et al. ................. 257/94 |
| 2002/0074552 A1 | 6/2002 | Weeks, Jr. et al. |
| 2002/0123163 A1 | 9/2002 | Fujii ........................... 438/26 |
| 2002/0127751 A1 | 9/2002 | Gardner et al. ................ 438/22 |
| 2002/0134985 A1 | 9/2002 | Chen et al. .................... 257/79 |
| 2002/0145148 A1 * | 10/2002 | Okuyama et al. ............. 257/88 |
| 2002/0180351 A1 | 12/2002 | McNulty et al. ............ 313/512 |
| 2002/0197764 A1 | 12/2002 | Uemura et al. |
| 2003/0057444 A1 * | 3/2003 | Niki et al. ................... 257/200 |
| 2003/0075723 A1 | 4/2003 | Heremans et al. .............. 257/98 |
| 2003/0085411 A1 * | 5/2003 | Shibata et al. ............... 257/190 |
| 2003/0178702 A1 | 9/2003 | Sawaki et al. |
| 2003/0183827 A1 * | 10/2003 | Kawaguchi et al. ........... 257/79 |
| 2004/0113163 A1 * | 6/2004 | Steigerwald et al. .......... 257/88 |
| 2004/0113167 A1 * | 6/2004 | Bader et al. .................... 257/98 |
| 2005/0095768 A1 * | 5/2005 | Tsuda et al. ................. 438/200 |
| 2005/0185419 A1 | 8/2005 | Holman et al. |
| 2006/0054905 A1 | 3/2006 | Schwach et al. .............. 257/89 |
| 2006/0175624 A1 | 8/2006 | Sharma et al. ................. 257/94 |

FOREIGN PATENT DOCUMENTS

| | | |
|---|---|---|
| JP | 11-274568 | 10/1999 |
| WO | WO 02/065553 | 8/2002 |
| WO | WO 2005/064666 | 7/2005 |

OTHER PUBLICATIONS

Motokazu Yamada et al.; InGaN-Based Near-Ultraviolet and Blue-Light-Emitting Diodes with High External Quantum Efficiency Using a Patterned Sapphire Substrate; Japan J. Appl. Phys. vol. 41 (2002) pp. L1431-L1433.

Kazuyuki Tadatomo et al.; High Output Power InGaN Ultraviolet Light-Emitting Diodes Fabricated on Patterned Substrates Using Metalorganic Vapor Phase Epitaxy; Japan J. Appl. Phys. vol. 40 (2001) pp. L583-L585.

Schnitzer et al., "30% External Quantum Efficiency From Surface Textured, Thin-Film Light-Emitting Diodes", *Appl. Phys. Lett.*, vol. 63, No. 16, pp. 2174-2176 (1993).

Windisch et al., "Light-Extraction Mechanisms in High-Efficiency Surface-Textured Light-Emitting Diodes", *IEEE Journal on Selected Topics in Quantum Electronics*, vol. 8, No. 2, pp. 248-255 (2002).

Sharma et al., "Outlook For High Efficiency Solar Cells To Be Used With And Without Concentration", Energy Convers. MGMT. vol. 36 (4), 1995 Elsevier Science Ltd., pp. 239-255.

Sun et al., "Enhancement of light extraction of GaN-based light-emitting diodes with a microstructure array", XP-002453008, Opt. Eng. 43 (8) (Aug. 2004), pp. 1700-1701.

Pan et al., "Improvement of InGaN-GaN Light-Emitting Diodes With Surface-Textured Indium-Tin-Oxide Transparent Ohmic Contacts", XP-002453009, IEEE Photonics Technology Letters, vol. 15 (5), May 2003, pp. 649-651.

* cited by examiner

OPTICAL DEVICES FEATURING TEXTURED SEMICONDUCTOR LAYERS

CROSS REFERENCE TO RELATED APPLICATIONS

This application claims the priority of U.S. Provisional Application No. 60/562,489 filed Apr. 15, 2004 and entitled, FORMATION OF TEXTURED III-NITRIDE TEMPLATES FOR THE FABRICATION OF EFFICIENT OPTICAL DEVICES, U.S. Provisional Application No. 60/615,047 filed Oct. 1, 2004 and entitled, FORMATION OF TEXTURED III-NITRIDE TEMPLATES FOR THE FABRICATION OF EFFICIENT OPTICAL DEVICES, and U.S. Provisional Application No. 60/645,704 filed Jan. 21, 2005 and entitled, NITRIDE LEDS BASED ON FLAT AND WRINKLED QUANTUM WELLS, which are each hereby incorporated by reference herein.

STATEMENT REGARDING FEDERALLY SPONSORED RESEARCH OR DEVELOPMENT

Part of the work leading to this invention was carried out with United States Government support provided under Contract No. DAAD19-00-2-0004 awarded by United States Army Research Office. Thus, the United States Government has certain rights in this invention.

BACKGROUND OF THE INVENTION

A light emitting diode (LED) is a semiconductor optical device capable of producing light in the infrared, visible or ultraviolet (UV) region. LEDs emitting in the visible and ultraviolet are made using gallium nitride (GaN) and its alloys with indium nitride (InN) and aluminum nitride (AlN). These devices generally consist of p and n-type semiconductor layers arranged into a p-n junction. In a standard LED device, semiconductor layers are evenly grown onto a polished substrate such as silicon. A typical semiconductor layer is composed of gallium nitride (GaN) that has been doped to be a p or n-type layer.

Important figures of merit for a LED are its internal quantum efficiency (IQE) and light extraction efficiency. For a typical LED the IQE depends on many factors, such as the concentration of point defect, Auger processes and device design. In the case of Nitride LEDs grown along polar (0001) and (000-1) directions the internal efficiency is also reduced due to the distortion of the quantum wells between the n- and p-doped layers caused by the internal electric fields. The light extraction efficiency of LEDs based on GaN is determined from Snell's law to be 4%. An LED commonly includes several quantum wells made of a small energy gap semiconductor (well) and a wider bandgap semiconductor (barrier) Visible LEDs employ indium gallium nitride (InGaN) as the well and GaN as the barrier. Ultraviolet LEDs employ AlGaN of different compositions as both wells and barriers. The internal quantum efficiency of an LED device based on nitride semiconductors grown along polar direction is reduced by electric fields across its quantum wells. This phenomenon is referred to as the quantum confined Stark effect (QCSE). The QCSE affects LED light emission by red shifting the emission wavelength and reducing photoluminescence intensity. The rather small value of light extraction efficiency is the result of the high refraction index of the semiconductor layer at the exit interface.

SUMMARY OF THE INVENTION

The present invention provides a device for use as a light emitter or sensor or as a solar cell. For an emitter of the invention, the IQE and light extraction efficiency is improved over conventional devices. For a sensor or solar cell, the efficiency of coupling light into the device is also improved. In one embodiment, the semiconductor material is deposited in layers, starting with as grown textured initial semiconductor layer deposited onto a substrate. In one embodiment, the layer is textured as grown on the substrate so as to have a textured surface morphology. In an embodiment the substrate is surface textured and the first and subsequent layers replicate substrate texturing. In an embodiment the substrate is untextured on the surface underlying the first layer. In an embodiment the substrate includes a textured surface on a side away from the first layer. The substrate and textured layer can be used as a template for the growth of multiple semiconductor layers. For example, a device may comprise a second layer deposited onto the first textured layer. These layers can be deposited with p and n dopants to form a p-n junction light emitting diode (LED). The textured emitting layer enhances light escape. The initial semiconductor layer preferably serves as a barrier layer onto which a quantum well layer is grown. Each of the semiconductor layers conforms to the texture of the first grown layer and thus the external surface of the LED from where the light is extracted has approximately the same texture as the initial semiconductor layer.

Preferably, multiple quantum wells comprising a plurality of barrier and quantum well layers are deposited on one another as alternating semiconductor layers each replicating the original texture. The texturing replicated through the barrier and well layers repositions the quantum wells so that their surfaces are not perpendicular to the [0001] polar direction and thus the quantum wells maintain their square well shape since they are not distorted by internal fields due to polarization. As a result the hole and electron wavefunctions overlap leading to efficient recombination and thus drastically improving the IQE.

Devices of the invention can comprise substrates such as silicon (Si), gallium arsenide (GaAs), gallium nitride (GaN), aluminum nitride (AlN), indium nitride (InN), aluminum gallium nitride (AlGaN), indium gallium nitride, indium aluminum nitride, indium gallium aluminum nitride (InAlGaN), silicon carbide, zinc oxide and sapphire. The sapphire substrate may also undergo nitridation before a layer is deposited thereon.

Semiconductor layers grown on the textured substrate, or on another layer in the total growth process, can be deposited by any suitable process. Examples of such deposition processes include halide vapor phase epitaxy (HVPE), molecular beam epitaxy (MBE), metal-organic chemical vapor deposition (MOCVD), liquid phase epitaxy and laser ablation. A layer of a semiconductor device may comprise of III-Nitride materials such as GaN, AlN InN or any combination of these materials. The substrate may be textured before layer growth or by choosing appropriate conditions of growth the first semiconductor layer on the substrate has a textured surface.

The semiconductor layer can comprise a dopant so that the layer is p or n-type. Exemplary dopants may include beryllium, selenium, germanium, magnesium, zinc, calcium, Si, sulfur, oxygen or a combination of these dopants. A layer may also be a mono or poly crystalline layer. A device of the invention also can include several p and n-type layers and one or more buffer layers, which generally aid layer growth. An exemplary buffer layer is a GaN semiconductor layer. A buffer layer may be deposited onto a substrate or between semiconductor layers.

The semiconductor layer for a device of the invention may be deposited to be from about 10 angstroms (Å) to 10 microns (μm) thick. The texturing of a substrate and the deposited layers have an average peak-to-valley distance of about 100 nanometers (nm) to 5 μm.

The present invention also provides a method of fabricating a semiconductor device of the invention. The method comprises providing a substrate and growing a first semiconductor layer on the surface of the substrate. The first layer can be textured spontaneously as grown or textured by a textured substrate surface. The substrate or first layer can then be used as a template to deposit other semiconductor layers having the same texture as the template. In a preferred embodiment, a fabrication method includes growing several quantum wells. The multiple quantum wells are textured by the first layer, substrate or a combination thereof.

DESCRIPTION OF THE DRAWINGS

Other features and advantages of the present invention will be apparent from the detailed description of the invention that follows, taken in conjunction with the accompanying drawings of which.

DETAILED DESCRIPTION OF THE INVENTION

An LED or photodetector of the present invention has improvement in one or both of light external extraction efficiency and internal quantum efficiency. Light extraction efficiency is improved with a textured emitting surface which is typically replicated through the process of applying layers from an initial semiconductor substrate layer. Control over growth rate and use of appropriate deposition procedures will form a textured surface layer on the initial semiconductor layer. This texture is replicated through subsequent layers as they are applied resulting in an emitting layer that has greatly improved light extraction efficiency. Final surface texturing can also be achieved by separately texturing the underlying substrate or using an unpolished substrate which is decorated with deep groves since the wafers are usually cut from an ingot using a saw.

Improvement in internal quantum efficiency of an LED is achieved through the incorporation of multiple quantum wells (MQWs), in the p-n junction. This results in better confinement of injected electrons and holes from the n- and p-sides respectively and thus more efficient recombination.

When a semiconductor device containing quantum wells is grown on a polar orientation the quantum wells resulting in separation of the holes and electrons. This places the electron-hole regions farther apart reducing the efficiency of hole-electron recombination for the generation of light. The LED of the invention overcomes this deficiency by growing the quantum wells on a textured surface. This way the quantum wells are not distorted and thus the electrons and holes in the wells recombine more efficiently.

Figure 1:
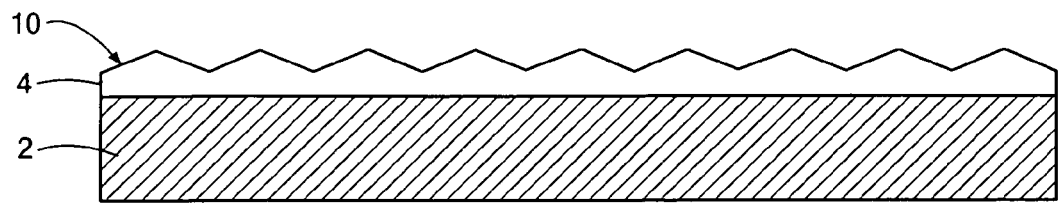
FIG. 1 is a partial representation of a textured template of the invention.
Figure 2A:
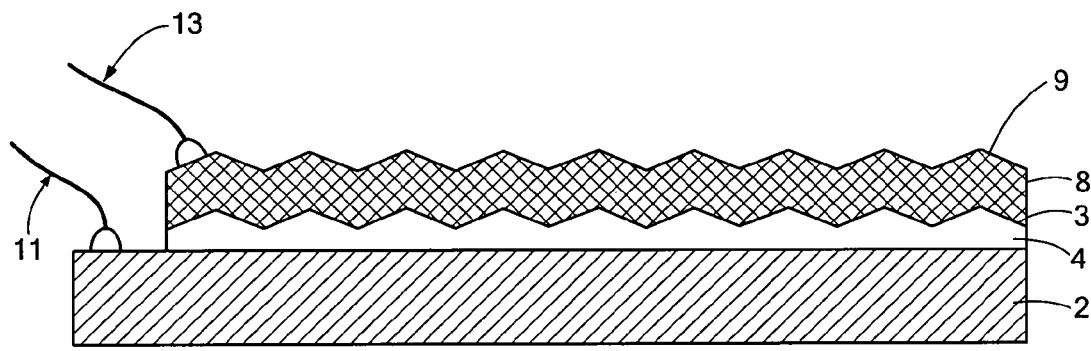
FIGS. 2a and 2b are partial representations of a semiconductor layer deposited onto the textured template of FIG. 1 to form a p-n junction.

In one embodiment of the LED according to the present invention the LED is formed on a substrate 2 with a textured semiconductor layer 4 deposited onto the substrate as shown in FIG. 1a and FIGS. 2a and b, more fully discussed below. The layer is textured as grown on the substrate so as to have a textured surface topology (or morphology) 10. The substrate and textured layer can be used as a template for the growth of multiple semiconductor layers to form the LED. Such textured AlN templates may also be used to produce UV LEDs. For example, a device may comprise a second layer deposited onto the first textured layer. These layers can be doped to form a p-n junction for a light emitting diode (LED). Appropriate dopants can include selenium, germanium, magnesium zinc, magnesium, beryllium, calcium, Si, sulfur, oxygen or any combinations thereof. Each of the semiconductor layers can be textured by replication from the first grown layer and its textured surface to have a textured emitting surface of improved extraction efficiency.

Figure 3A:
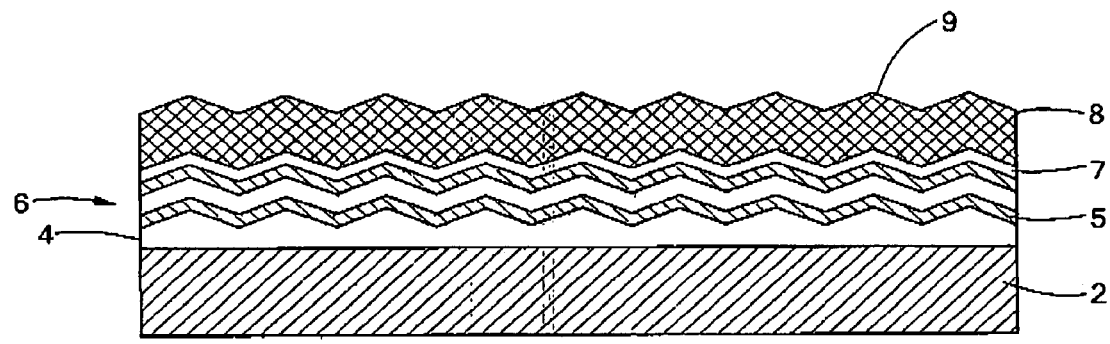
FIGS. 3a, 3b, and 3c are partial representations of multiple quantum wells deposited onto the textured template of FIG. 1.

In a second embodiment, as shown in FIGS. 3a, b, FIGS. 4a, b, and FIGS. 5a, b, more fully discussed below, multiple quantum wells comprising a plurality of barrier and quantum well layers are deposited on one another as alternating semiconductor layers between the n- and p-doped layers of the device. The multiple quantum wells are textured by replication from the textured surface of the first layer as they are grown thereon.

In most cases a cladding layer of n-doped AlGaN of variable thickness between the textured layer and the quantum wells is grown.

Suitable substrates that can be used for growth of the first layers are known in the art. Exemplary substrates include sapphire, gallium arsenide (GaAs), gallium nitride (GaN), aluminum nitride (AlN), silicon carbide, zinc oxide and silicon (Si). For example, a preferred substrate can include (0001) zinc oxide, (111) Si, (111) GaAs, (0001) GaN, (0001) AlN, (0001) sapphire, (11-20) sapphire, (10-12) sapphire and (0001) silicon carbide.

A substrate for a device of the invention can be prepared for semiconductor layer growth by chemically cleaning a growth surface. Optionally, a growth surface of the substrate may be polished. The substrate may also be thermally out-gassed prior to layer growth. The surface of the substrate can be optionally exposed to nitridation such as disclosed in U.S. Pat. No. 5,677,538, which is incorporated by reference herein. Growth on an unpolished, raw, as cut substrate facilitates growing a textured surface on it.

A semiconductor layer may be grown by processes such as halide vapor phase epitaxy (HVPE), metal-organic chemical vapor deposition (MOCVD) or molecular beam epitaxy (MBE), liquid phase epitaxy (LPE), laser ablations and variations of these methods. Typical growth processes have been disclosed in U.S. Pat. Nos. 5,725,674, 6,123,768, 5,847,397 and 5,385,862, which are incorporated by reference herein. The semiconductor layer can also be grown in the presence of nitrogen to yield a nitride layer. Examples of a nitride layer are GaN, InN, AlN and their alloys.

FIG. 1a shows a partial representation of a semiconductor device of the invention. In a preferred embodiment, the device is a textured template comprising a substrate 2 and first layer 4 textured as grown thereon. The substrate 2 can be textured or polished smooth initially. The first layer 4 is textured as grown on the substrate 2 to have a textured surface topology 10. Preferably, the first layer is grown by a modified HVPE deposition process to create the textured surface 10. The modified HVPE process yields a textured as grown first layer in part by etching defective areas of the layer with an increased hydrochloric acid (HCl) concentration. The HCl concentration of the modified HVPE process is substantially higher than that of typical deposition processes as exemplified below.

In one embodiment, the first layer 4 can be a semiconductor layer comprising a group III nitride layer. The layer 4 is preferably a p or n-type semiconductor layer by suitable doping during deposition or it can be an insulating layer as for example AlN or both as shown below. A layer 4 can optionally be grown on a buffer layer deposited onto the substrate such as described in U.S. Pat. No. 6,686,738, which is incorporated by reference herein.

The thickness of the substrate 2 and layer 4 can cover a broad range, although the thickness of the layer 4 may vary the extent of texturing replicated at its surface. For example, a 10 nm thick layer can have a peak-to-valley texture distance of about 100 nm to 5 µm. The texturing of the semiconductor layer affects its light extraction characteristics of LED layers grown thereon that replicate the texture. The semiconductor layer 4 is typically randomly textured as grown. Layer 4 may be single or poly crystalline material.

Figure 2B:
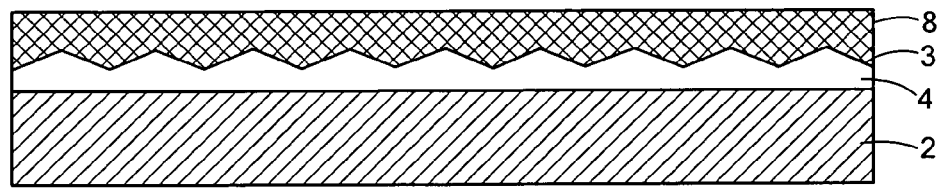

FIG. 2a shows a second layer 8 grown onto the device of FIG. 1. The layer 8 can be grown by any suitable deposition process. The second layer is grown on the textured surface 10 of the first layer 4. The second layer 8 is preferably not so thick so as to bury the textured surface topology 10 of the first layer 4 as shown in FIG. 2b. Preferably, the second layer 8 can have an upper surface 9 that is textured by replication by the layer 4 as shown in FIG. 2a.

Preferably, the layer 8 is a semiconductor layer comprising a group III nitride. The second layer 8 is typically a p or n-type semiconductor layer opposite to the doping of layer 4. The second layer 8 may be a single or poly crystalline semiconductor layer. In one embodiment, the first and second layers 4 and 8 doping forms a p-n junction 3 for use as a photosensor or emitter. These devices can be used for electronic displays, solid state lights, computers or solar panels. Electrodes 11 and 13 connect to the layers 4 and 8 as is know in the art for such use.

Figure 3B:
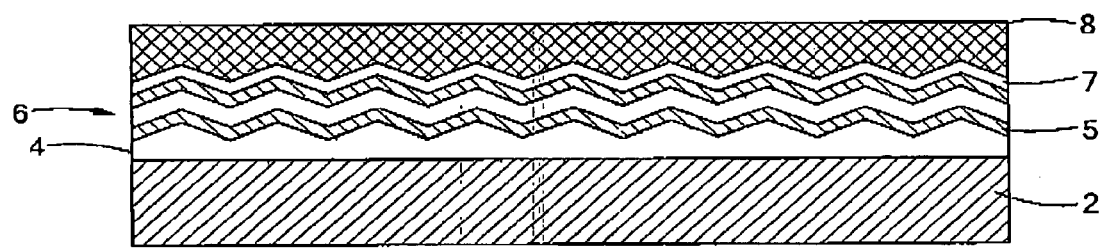
Figure 3C:
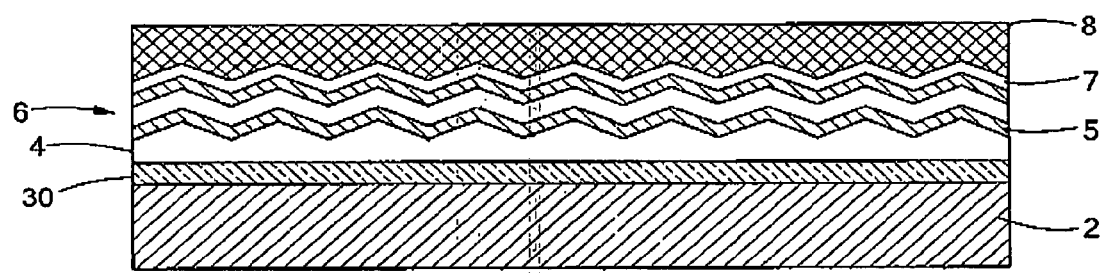

FIGS. 3a and 3b are partial representations of an LED having multiple quantum wells 6 grown onto the device of FIG. 1. The quantum wells 6 are textured by the surface topology of the first layer 4. As described above, the first layer 4 can be textured as grown onto the substrate 2. Alternatively, as shown in FIG. 3c, buffer layer 30 can be grown onto substrate 2, and first layer 4 can be textured as grown onto buffer layer 30. In one embodiment, the multiple quantum wells 6 can comprise one or more barrier layers 5 and alternating quantum well layers 7.

Several barrier layers 5 and quantum well layers 7 can be grown as alternating semiconductor layers each replicating the textured first layer 4. For example, quantum wells can be formed by a barrier layer 5 grown on the first layer 2. A quantum well layer 7 is then grown onto the barrier layer 5. A second barrier layer 5 is then grown on the quantum well layer 7 followed by a second quantum well layer. In one embodiment, the composition of quantum well layer 7 and first layer 4 are matched in composition. A barrier layer 5 can have a composition that differs from both the first 4 and quantum well layer 7.

The barrier layer 5 may comprise one or more group III-V nitride compounds. In one embodiment, one or more barrier layers 5 are AlGaN. Similarly, one or more quantum well layers 7 are a group III Nitride such as GaN, or another III-V compound. The layers can also be grown by any suitable deposition process. A barrier layer 5 or quantum well layer 7 can have a buffer layer grown between one another. The layers may be single or poly crystalline layers.

The thickness of the layers is typically thin enough for texturing to replicate to the surfaces. The extent of texturing with the layers can affect internal quantum efficiency and light extraction efficiency. Preferably, a device of the invention comprises from one to twenty quantum wells that comprise a plurality of barrier layers 5 and quantum well layers 7.

FIGS. 3a and 3b also show an upper semiconductor layer 8 grown on the multiple textured quantum wells 6. The layer 8 can be grown by a known deposition process and may be a textured layer 9 (FIG. 3a) or be so thick so as to bury the textured surface topology of the first layer 4 (FIG. 3b) or have it polished off.

Preferably, the layer 8 is a semiconductor layer comprising a group III nitride. The upper layer 8 may also be a p or n-type semiconductor layer, opposite to the layer 4 so as to form a p-n junction. The p-n junction allows functioning as a semiconductor device such as an LED or photodetector. The upper layer 8 can be a single or poly crystalline semiconductor layer. The multiple quantum wells 6 can also comprise textured as grown barrier layers 5 and quantum well layers 7. For example, layers 5 and 7 may be grown by the modified HVPE deposition process described above.

The device structure shown in FIG. 3a can exhibit internal quantum efficiencies and external light extraction efficiencies that are significantly higher than the efficiencies of a conventional device. The FIG. 3b device possesses internal quantum efficiency increases overall.

A device of the invention can have a light extraction efficiency approaching one-hundred (100) percent, for example, greater than 99%. Similarly, such a device may have an internal quantum efficiency at least two times higher than a similar device with a smooth first layer instead of a textured first layer, for example, in the range of fifty to sixty percent.

Figure 4A:
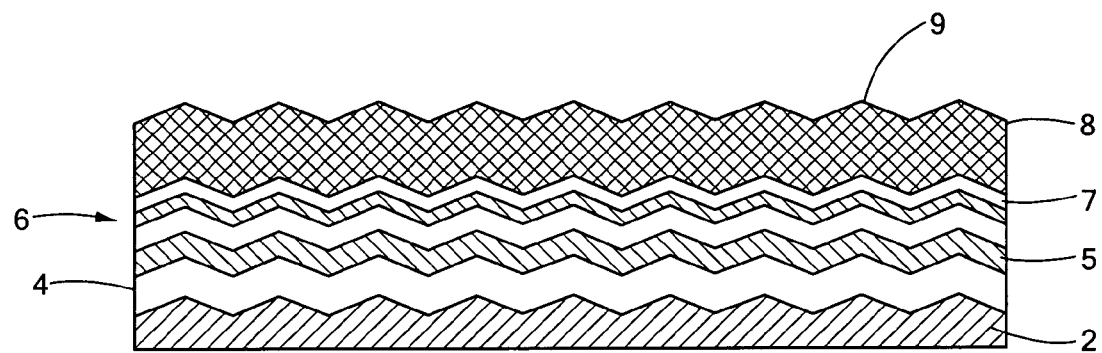
FIGS. 4a and 4b are partial representations of a substrate having a textured surface that textures semiconductor layers including multiple quantum wells deposited thereon.
Figure 4B:
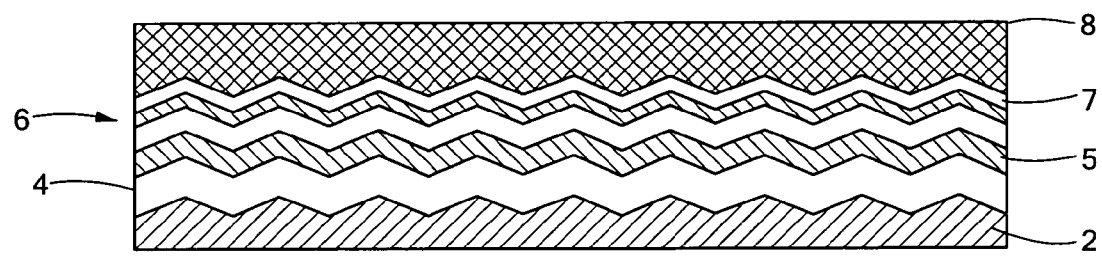

FIGS. 4a and 4b show a device with a substrate having an initial textured surface. Subsequent layers from the first layer 4 can be deposited on the textured substrate 2 such that the upper surfaces are textured by replication.

The device of FIG. 4a includes a texture layer 9 on layer 8 or in FIG. 4b, an untextured layer in that embodiment.

Figure 5A:
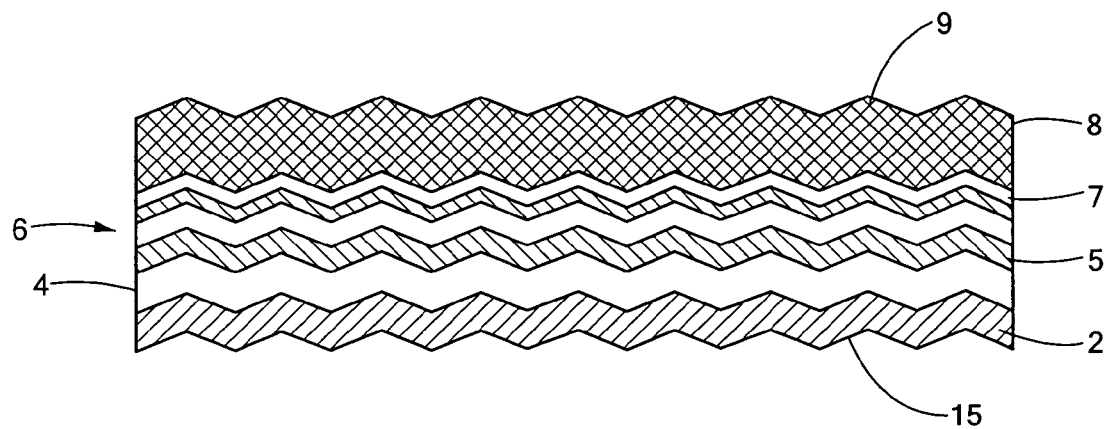
FIGS. 5a, 5b and 5c are partial representations of a substrate having textured surfaces with textured semiconductor layers including multiple quantum wells deposited thereon.
Figure 5B:
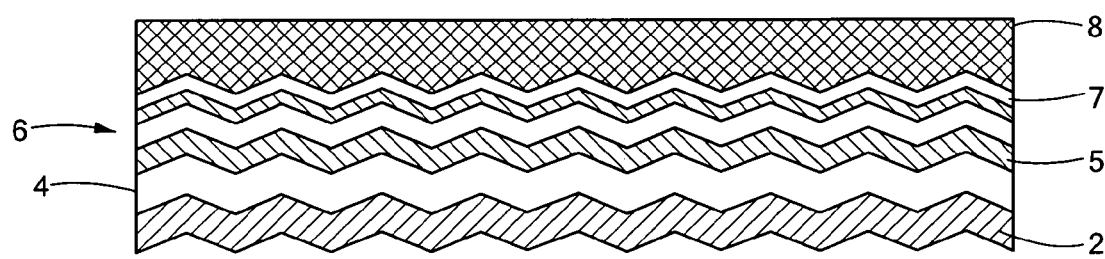

In an alternative embodiment, the substrate can comprise both upper and lower textured surfaces 9 and 15, as shown, for example, in FIG. 5a using substantially the same procedures as described above. In FIG. 5b, only bottom layer 2, surface 15 is textured and can function as an emitting surface.

Figure 5C:
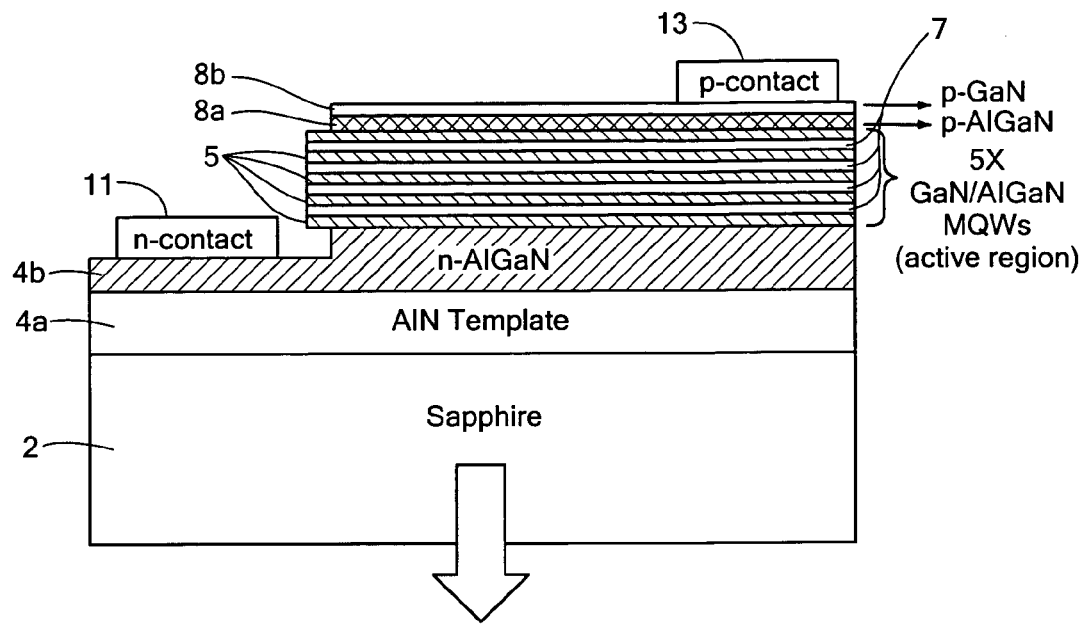

For example, FIG. 5c is an LED using a smooth AlN template 4a on a sapphire substrate 2. Between the AlN template and the quantum well and barrier layers 7 and 5 there is a thick AlGaN layer 4b known as cladding or contact layer. This layer can be used with other forms of the invention described herein. Over those are p doped layers layers 8a and 8b of AlGaN and GaN respectively. Layers 4b and 8b receive electrical connections 11 and 13 with light extraction downward through sapphire substrate 2. Layer 8a can be used with other forms of the invention described herein and functions as an electron blocking layer preventing the loss of electrons. Layers 5 and 7 while shown smooth for clarity are to be understood to be wrinkled as desired.

The present invention also provides a method of fabricating a semiconductor device of the invention. The method comprises providing a substrate and growing a first semiconductor layer on the surface of the substrate. The first layer can be textured as grown or textured by a textured substrate surface as described below. The substrate or first layer can then be used as a template to deposit and texture other semiconductor layers. Such a template can be sold at this stage of production, allowing others to complete the layering replicating the texture up to the emitting layer.

In a preferred embodiment, a fabrication method includes growing several quantum wells in which the wells comprise both barrier and quantum well layers that can be deposited as alternating semiconductor layers. The multiple quantum wells are textured by the first layer, substrate or a combination thereof.

The examples herein are provided to illustrate advantages of the present invention. The examples can include or incorporate any of the variations or embodiments of the invention described above. The embodiments described above may also each include or incorporate the variations of any or all other embodiments of the invention. The following examples are not intended in any way to limit the scope of the invention.

Example I

A textured GaN template according to the invention is grown by the modified HVPE process described above. The GaN template is grown via a modified HVPE reactor. In the reactor, a group III precursor is GaCl gas, which can be synthesized upstream by flowing HCl on a quartz-boat containing Ga at temperatures from about 500° C. to 1000° C. GaCl gas then mixes with ammonia ($NH_3$) downstream near the surface of the substrate wafer to form GaN at temperatures between about 900° C. to 1200° C. A GaN or AlN or AlGaN template of the invention can be grown along polar and nonpolar directions. The templates can also grow in their cubic structure by choosing a substrate having cubic symmetry such as for example (100)Si (001)GaAs. In this case the subsequent nitride layers grown on it will have cubic symmetry as well.

The modified reactor is generally divided into four zones in which each zone temperature can be individually controlled. The reactor also has three separate delivery tubes for the reactant gases and diluents. Nitrogen or hydrogen is used as a diluent and carrier gases to $NH_3$ and HCl. Nitrogen is sent through the middle tube where it acts as a downstream gas sheath to prevent the premixing of the GaCl and $NH_3$ before the gases contact the substrate surface. The texturing of the GaN layer can be attributed to the etching effects of HCl. For example, texturing occurs as HCl etches Ga from the surface of the growing layer. HCl also etches defective GaN at the boundary domains of the first layer. The HCl concentration of the modified HVPE process is substantially higher than that of typical deposition processes where texturing is avoided.

The textured GaN templates can be grown under high growth rate conditions ranging from about 30 to 200 μm per hr that is controlled by the flow ratio of $NH_3$ to the group III precursor. The flow ratio is typically about 300 to 10. The template's growth is performed by pretreatment of the substrate with GaCl gas at 1000° C. followed by the growth of a thin GaN buffer layer from 550° C. to 650° C. The growth area can then be ramped to about 1070° C. for high temperature epilayer growth of GaN. The substrate can also be pretreated prior to growth with sputtered zinc oxide. The usual thickness of the zinc oxide is from about 500 Å to 1500 Å. Growth of the template is then performed by heating the chamber to the growth temperature and flowing the reactant gases in order to initiate growth.

Figure 6A:
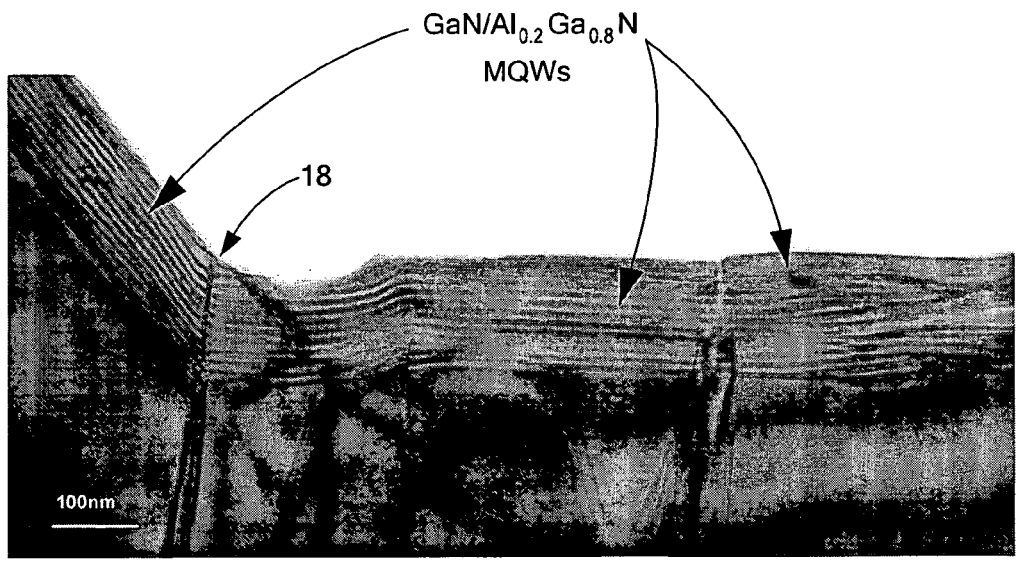
FIGS. 6a and 6b are respectively a TEM view of textured quantum wells and of a radiating electrically pumped, wafer level LED.
Figure 6B:
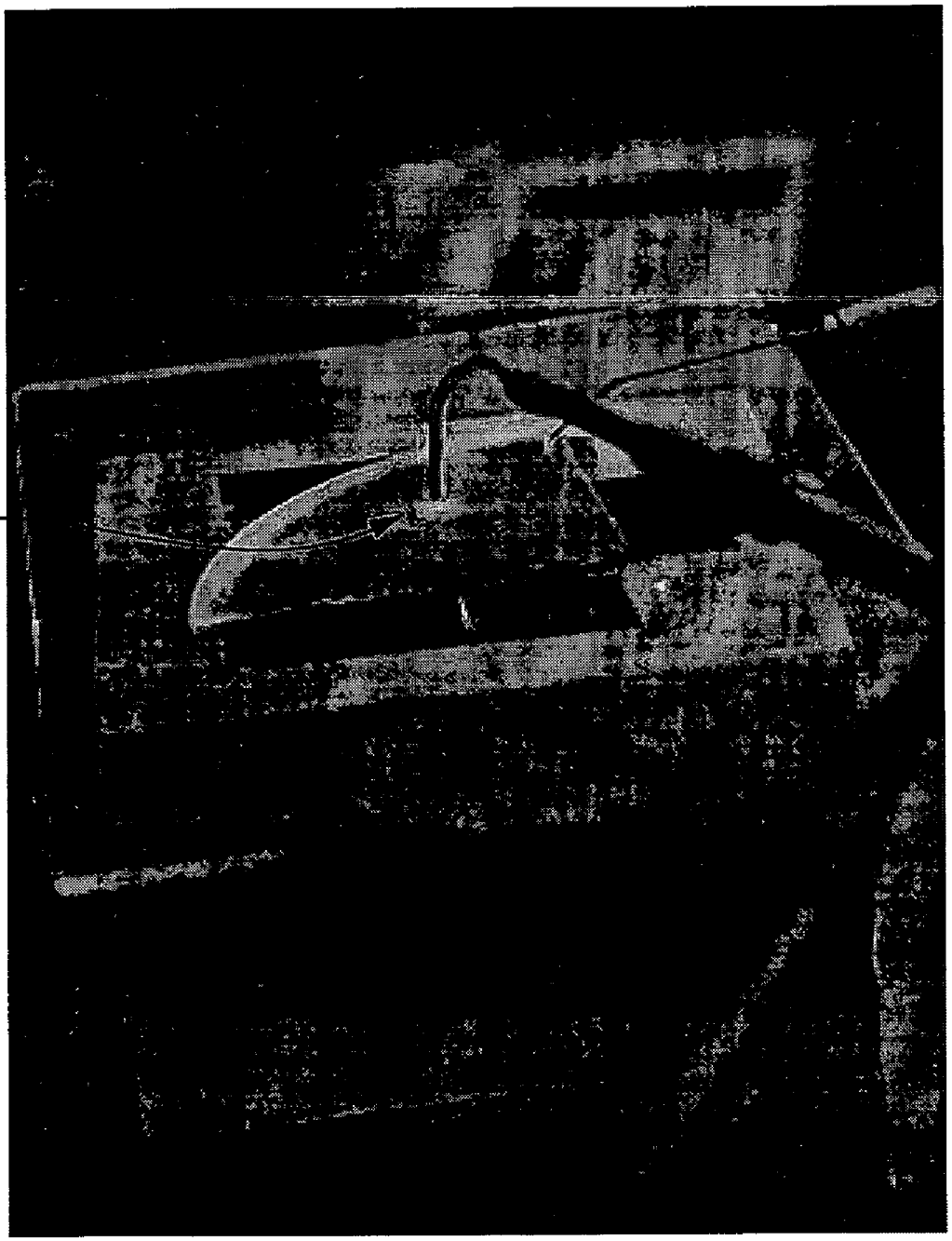

FIG. 6a shows a transmission electron microscope image showing multiple quantum wells at a textured surface (wrinkled quantum wells). At V groves 18 resulting from texturing, enhanced light generation occurs for all materials. FIG. 6b shows an electronically excited wafer lever LED radiating at 20. This Blue LED structure was made on an unpolished (0001) sapphire substrate. On this substrate was grown 3 microns of heavily doped n-type GaN, followed by 10 MQWs consisting of InGaN with 13% indiun as the wells and GaN as the barriers. The growth of the MQWs is followed by a thin (about 10 nm) electron blocking layer consisting of AlGaN with 30% Al doped p-type with magnesium and this is followed by 200 nm of heavily p-type doped GaN with magnesium. The free surface from where the light is emitted has replicated the morphology of the unpolished sapphire substrate.

Figure 7A:
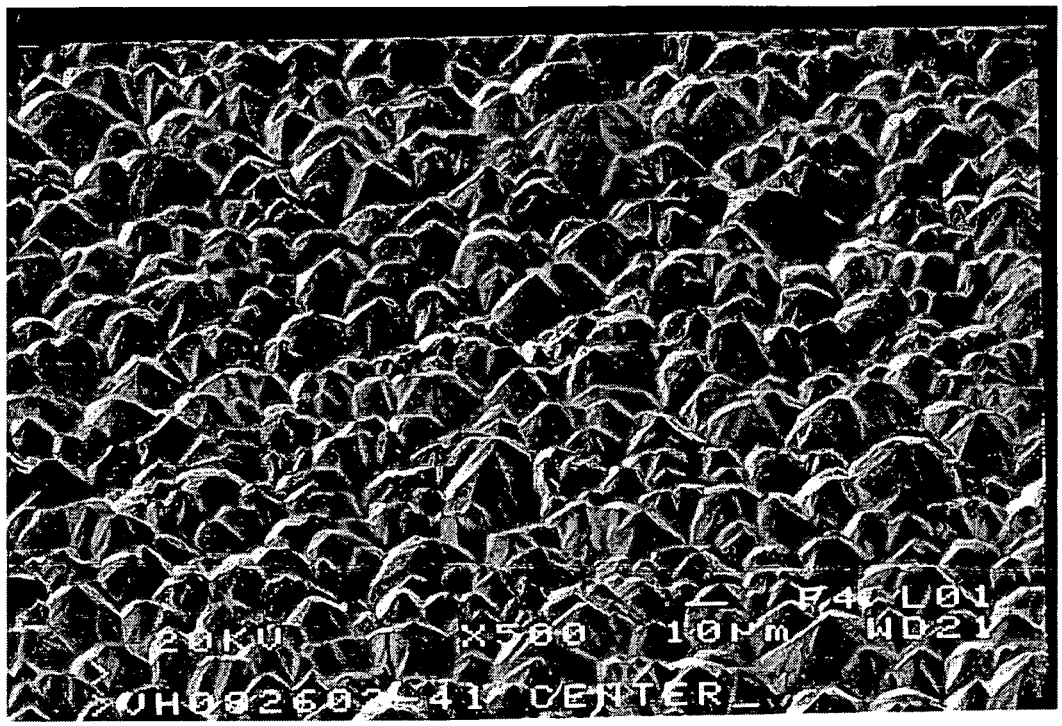
FIG. 7a is a scanning electron microscope (SEM) image of a gallium nitride (GaN) textured template of the invention.

FIG. 7a shows a scanning electron microscope (SEM) image of a GaN template randomly textured as grown via the modified HVPE process. The image was captured with the sample tilted about thirty degrees with respect to the electron beam. Growth of the GaN layer occurred on a (0001) sapphire substrate. The growth was performed via a process using 25 standard cubic centimeters per minute (sccm) of HCl during pretreatment at 1000° C. The process also employed a ratio of ammonia to the group III precursor of 150 during growth of a buffer layer at about 590° C. The stage of high temperature growth at 1070° C. then used an ammonia to group III ratio of 60. The extent or degree of texturing of the template was determined to be dependent upon the amount of GaCl arriving at the growth front. Such an amount of GaCl can also control the growth rate.

Figure 7B:
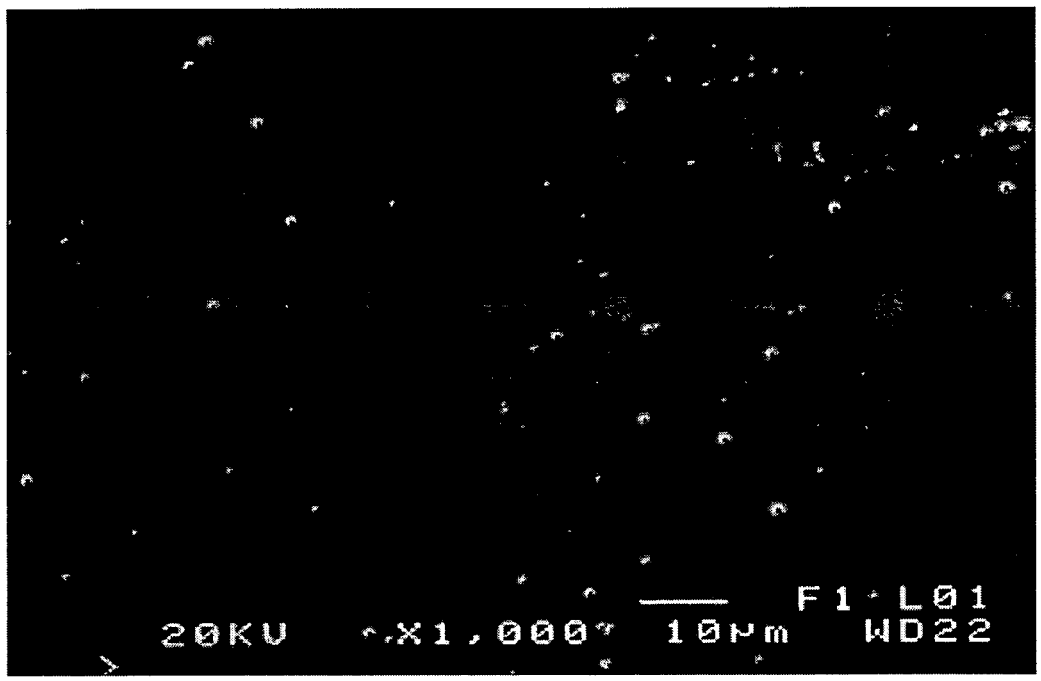
FIG. 7b is an SEM image of a conventional, smooth GaN semiconductor layer.

In comparison to FIG. 6, FIG. 7 shows an SEM image of a standard GaN layer that is atomically smooth. As shown, the surface topology of the conventional GaN layer is untextured despite a few surface defects. The image was captured with the sample tilted about thirty degrees with respect to the electron beam. Photoluminescence of the conventional GaN layer having an atomically smooth surface was compared to that of a randomly textured gallium nitride template of the invention. Both layer samples were measured at conditions that were identical using a 10 milliwatt (mW) helium cadmium laser as the excitation source.

Figure 8:
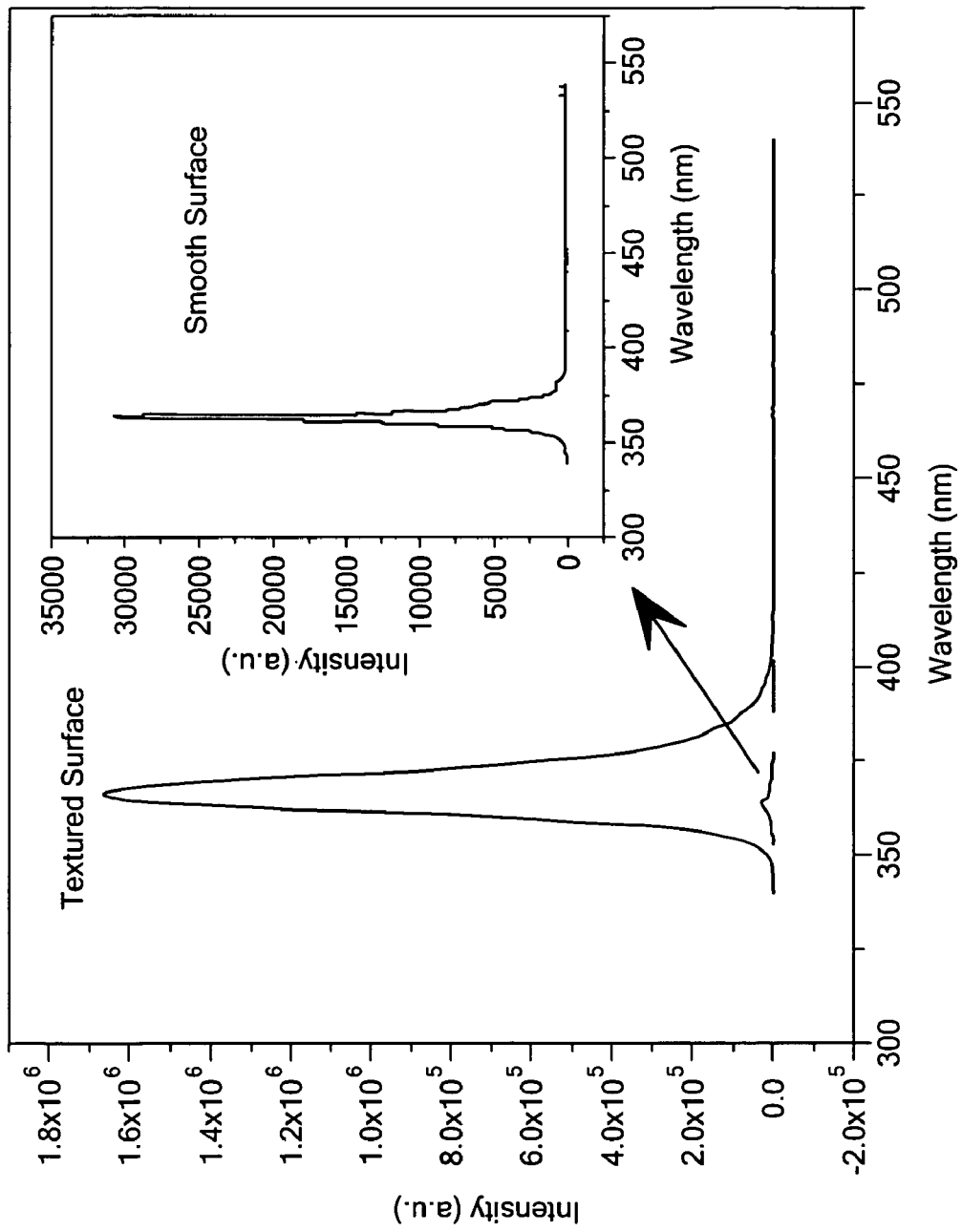
FIG. 8 is a comparison of photoluminescence between a conventional GaN layer and the textured template of FIG. 6.

The results of the comparison are shown by FIG. 8 in which the photoluminescence intensity of the textured template is more than fifty times greater than the intensity of the smooth GaN layer. Enhanced light extraction occurs through a surface that is textured particularly with the high index of refraction of such semiconductor layers. The textured surface provides an increase in the escape cone of a single photon compared to the limited escape cone by a high index of refraction change between a GaN layer and air.

Figure 9B:
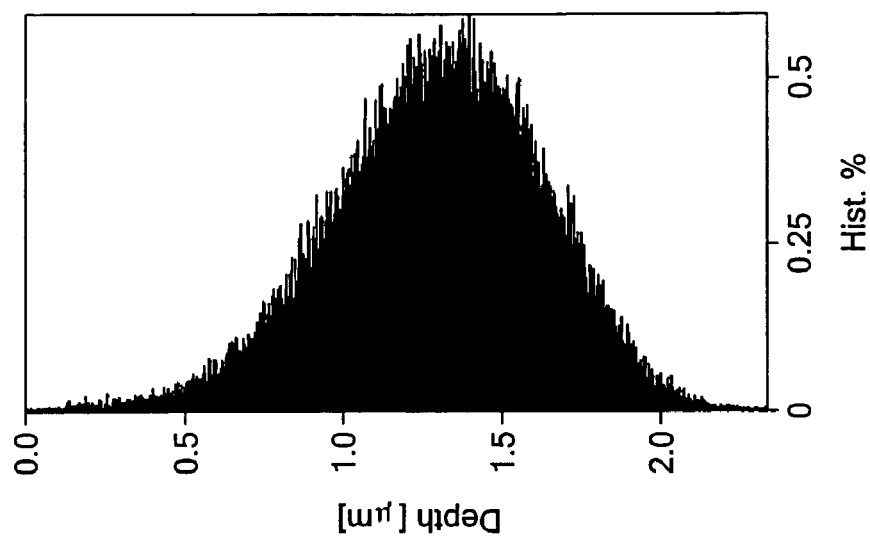
FIG. 9 is an atomic force microscope (AFM) image of the textured template of FIG. 6 with a depth analysis plot of the imaged area.
Figure 9A:
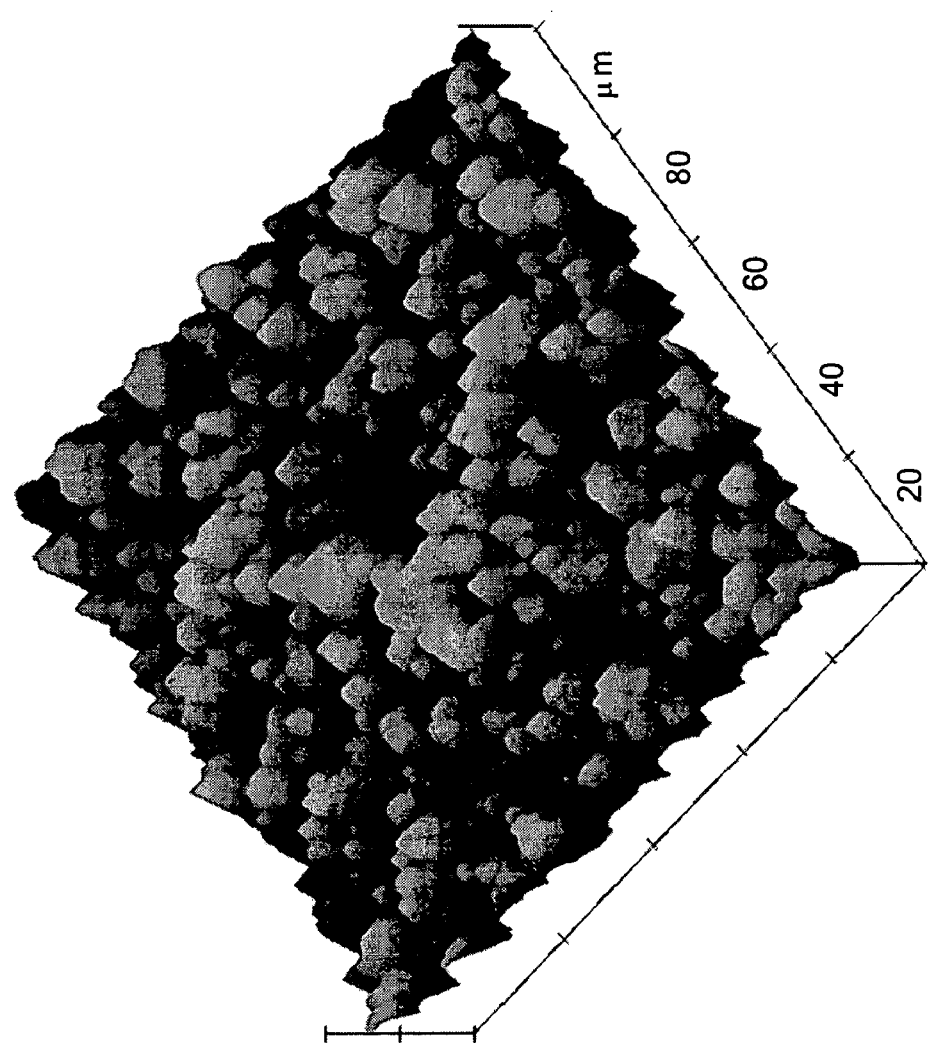

The randomness of texturing of a group III layer template of the invention is illustrated in FIGS. 9a and 9b. FIG. 9a is an atomic force microscope image of a GaN template of the invention with a depth analysis plot of the imaged area in FIG. 9b. The plot shows the Gaussian distribution of the surface topology for the template, characteristic of randomness. The average peak-to-valley surface topology is approximately 1.3 microns.

Example II

Example II involves the growth of multiple (wrinkled) quantum wells on a textured template of the invention. The quantum wells comprise ten pairs of AlGaN and GaN layers. An individual GaN layer may comprise a textured quantum well layer with the AlGaN layer serving as the barrier layer. The composition of the AlGaN layer, for example, is $Al_{0.2}Ga_{0.8}N$. Generally, that is $Al_xGa_{1-x}N$. The multiple quantum wells can also be made by any combination of small gap III-V nitride films (wells) and large gap III-V nitride films (barriers). The composition of the MQW determines the emission energy of light from about 0.7 eV of pure InN to 6 eV from pure AlN. The plurality of quantum well layers are grown by any suitable deposition process. A MBE process involves the reaction of a group III material with nitrogen that has been activated by radio frequency or microwave plasma. An alternative approach would be to react group III materials with ammonia on a heated substrate.

The group III materials for semiconductor growth through a growth process can be evaporated from effusion cells or may be provided in the form of group III alkyls. During semiconductor growth in an MBE or plasma-assisted MBE process, nitrogen or ammonia gas is typically used from about 1 to 50 sccm. As the quantum wells are grown, the layers of quantum wells replicate the texture of the template. Such MBE processes are known in the art. The invention also contemplates other typical approaches for semiconductor layer growth that may be employed by a person of ordinary skill within the art.

The ten pairs of AlGaN and GaN textured quantum wells had a well thickness of about 7 nanometers (nm) and a corresponding barrier layer thickness of about 8 nm. The plurality of quantum wells were grown with the substrate at a temperature of about 750° C. An AlGaN barrier layer is first grown upon a group III-V textured template of the invention. The barrier layer is then a surface for deposition of a quantum well, GaN layer. The GaN layer then serves as a growth surface for the next barrier layer. This growth pattern can be continued until multiple quantum well layers are formed. The wells replicate the surface topology of the underlying textured template. The thicknesses of the well and barrier layers can, for example, also be from 10 Å to more than 500 Å.

Figure 10:
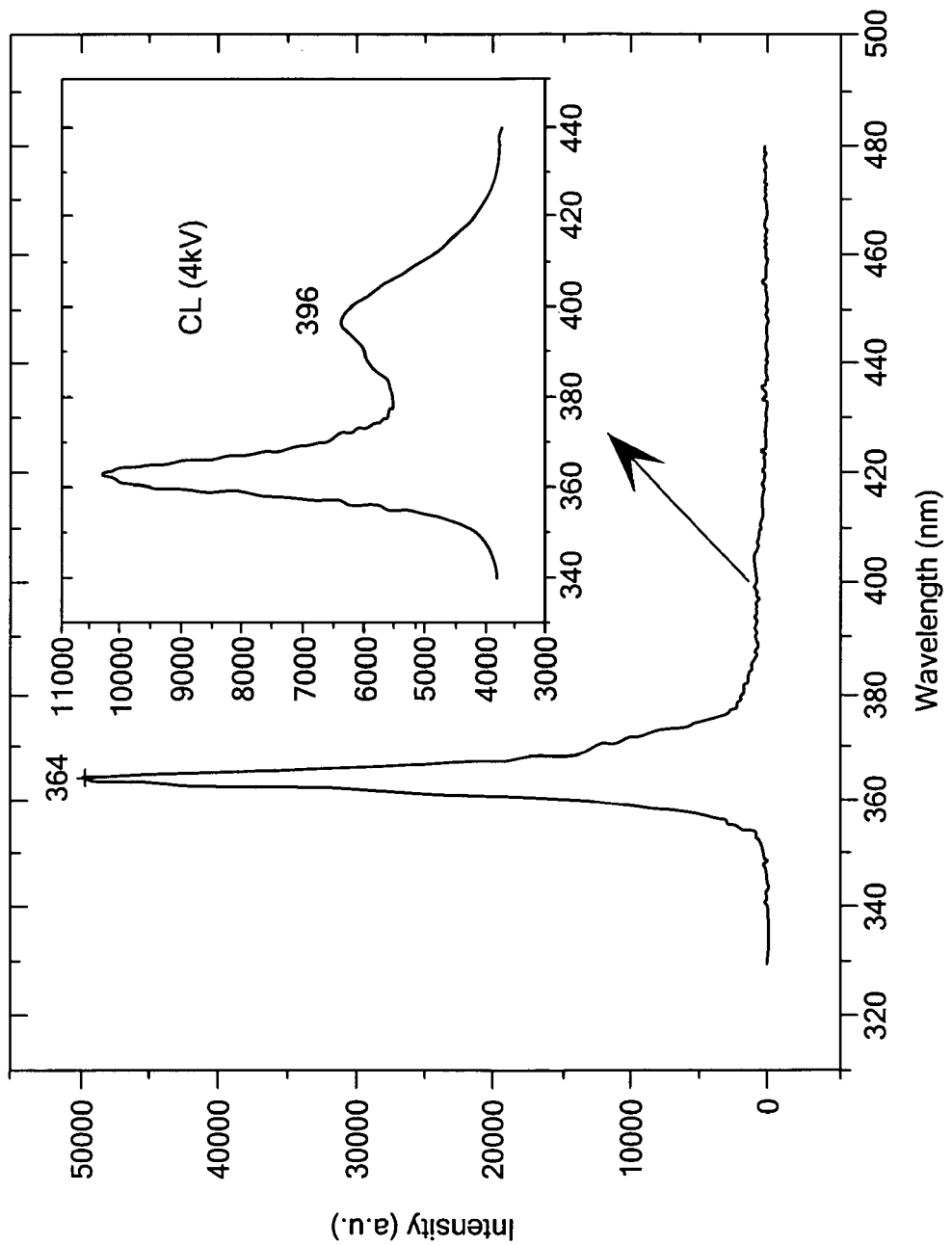
FIGS. 10 and 11 show photoluminescence spectra of conventional, smooth quantum wells and textured quantum wells grown on the textured template of FIG. 6.
Figure 11:
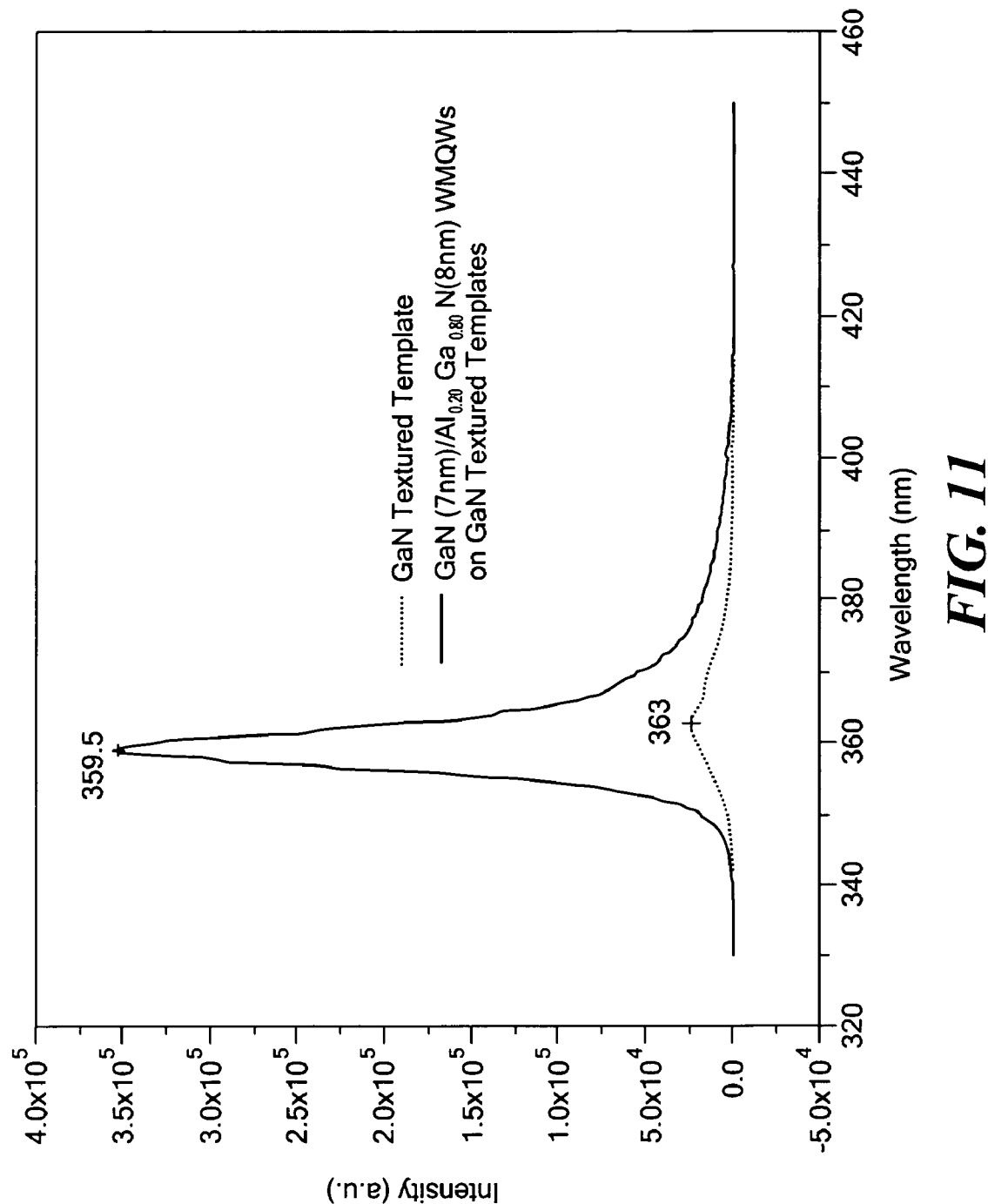

FIGS. 10 and 11 show photoluminescence spectra of conventional quantum wells and textured quantum wells grown on a textured template of the invention respectively. The photoluminescence spectrum from the quantum wells grown onto a conventional smooth GaN layer exhibits a high intensity peak at 364 nm, which is due primarily to the smooth bulk GaN layer underneath the MQWs. The extremely low and broad luminescence peak at about 396 nm was assumed to be partly due to the smooth wells. A cathodoluminescence spectrum of the smooth well sample was used to verify the assumption. The spectrum was performed using low acceleration voltage of about 4 kV in order to probe the quantum wells. The results are shown by the inset of FIG. 9. The results confirm that the broad peak occurring at 396 nm corresponds to the conventional quantum wells.

The luminescence observed from the smooth quantum wells is also shown to be greatly reduced in magnitude and red-shifted with respect to the bulk. These results are consistent with the quantum confined Stark effect (QCSE).

In comparison to typical quantum wells, those wells that are textured by a textured template of the invention are blue-shifted with respect to the luminescence of the bulk GaN layer. The plurality of textured quantum wells also exhibits substantially increased luminescence as compared to the template on which the wells are grown.

These results indicate that wrinkled wells formed on a textured group III-nitride template are not distorted by the internal fields associated with polarization. FIG. 11 also shows that the peak photoluminescence for the textured quantum wells is more than about seven hundred times higher than those grown on a conventional smooth GaN layer. The difference is due to both enhanced light extraction through the textured surface and the enhanced spontaneous emission rate of the quantum wells due to elimination of the QCSE.

Example III

Figure 12:
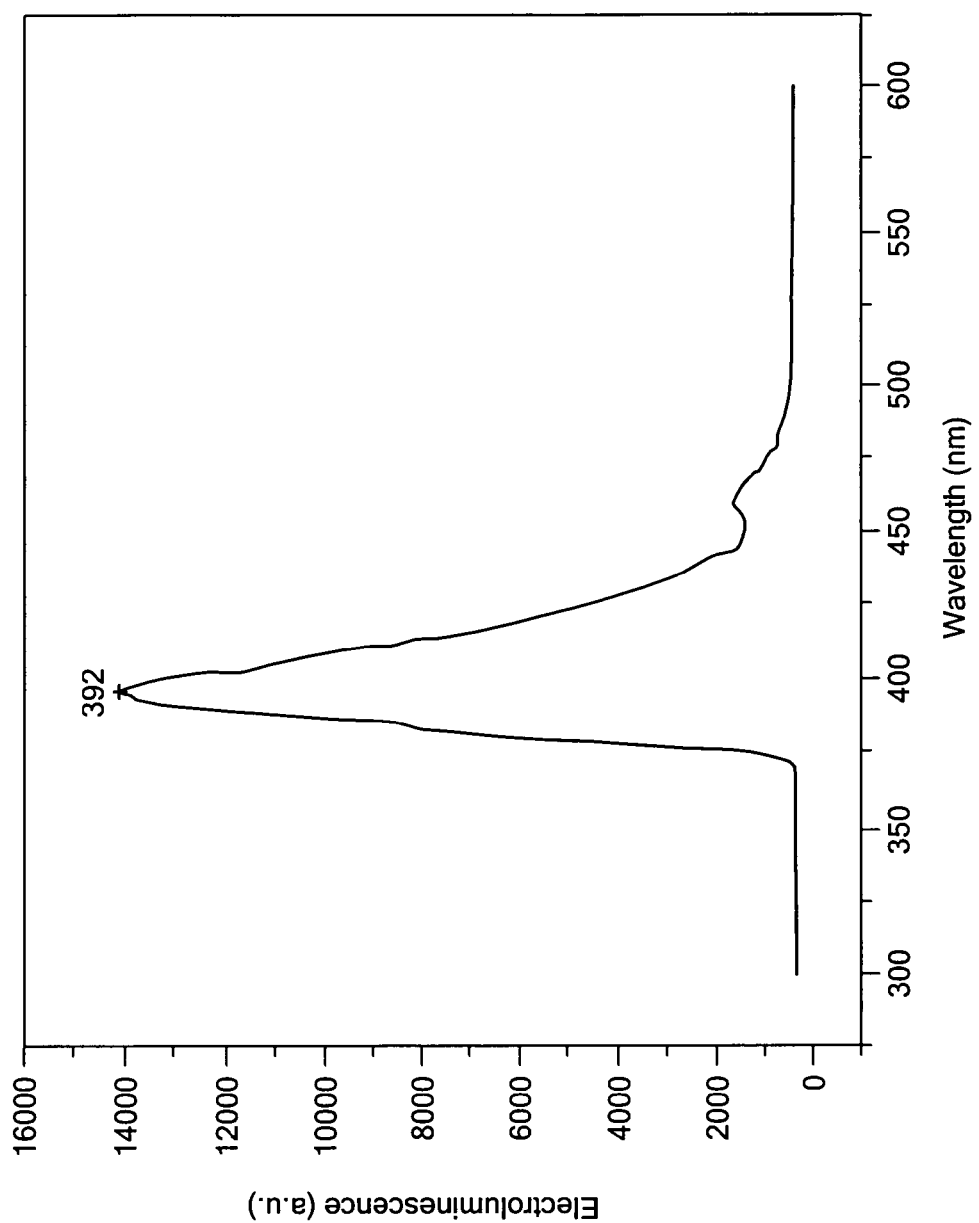
FIG. 12 is a photoluminescence spectrum of an LED device comprising the textured template of FIG. 6.

A highly conductive magnesium-doped p-type GaN layer with a hole concentration of about $10^{18}$ cm$^{-3}$ and a thickness of about 0.5 micrometers was deposited by molecular beam epitaxy (MBE) on top of an n-type textured gallium nitride template according to the invention. The textured gallium nitride template had an electron concentration of about $10^{19}$ cm$^{-3}$. The p-type GaN layer was formed using a radio frequency plasma source to activate molecular nitrogen and Knudsen effusion cells to evaporate the Ga and Mg. Growth occurred at extreme gallium rich conditions at which Mg was then incorporated at relatively high substrate temperatures of 700° C. to 800° C. Alternatively, the p-type layer could be grown using ammonia as the nitrogen source. A similar p-type layer could also have been grown by an MOCVD or HVPE process. FIG. 12 shows an electroluminescence spectrum of the p-n junction formed with the textured template under a current injunction of 80 mA.

Example IV

In Example IV, a textured substrate is created with a textured surface on which additional layers are grown, while replicating the textured features. The additional layers may be grown so as to form a textured template, a p-n junction or an optical device of the invention. The additional layer(s) may also comprise multiple quantum wells formed by a plurality of well and barrier layers. The surface of the substrate to be textured may be smooth or previously textured. The surface of the substrate can also be unaltered or otherwise natural.

A mask structure comprising a monolayer of monodisperse spherical colloidal particles is coated onto the surface of the substrate. The substrate can include silicon, silicon carbide, sapphire, gallium arsenide, gallium nitride, aluminum nitride or zinc oxide. Spherical monodisperse colloidal particles can be commercially obtained in sizes ranging from 0.02 to 10 microns. The packing of the particles onto the surface of the substrate may be either periodic or random depending on the technique used for coating. Coating of the mask structure over a one to five inch diameter portion of a substrate requires several minutes. Such a coated area can define $10^8$ to $10^{12}$ submicron features on the substrate.

The masked surface may then be etched by, for example, ion beam etching. The etching forms the individual particles into pillars on the substrate surface. The aspect ratio and shape of the pillars is determined by the relative mask etch rates and the underlying substrate material. To minimize the aspect ratio of the pillars, both reactive and chemically assisted ion beam etching can be employed. The surface of the substrate can then be etched by a liquid or gas such as hydrogen fluoride or argon. The etching of the substrate due to the liquid or gas is less significant in some areas than others as the pillars tend to retard or prevent portions of the substrate surface from being etched.

After etching, the pillars on the surface of the substrate can be removed by a solvent. The solvent dissolves the pillars to yield the substrate with a textured surface. The surface of the substrate can then be used to grow additional layers that replicate the textured features. This technique for etching and texturing the surface of a substrate has also been described in greater detail by Deckman et al., "Molecular-scale microporous superlattices," MRS Bulletin, pp. 24-26 (1987).

While the present invention has been described herein in conjunction with a preferred embodiment, a person of ordinary skill in the art, after reading the foregoing specification, will be able to effect changes, substitutions of equivalents and other alterations to the devices and methods that are set forth herein. Each embodiment described above can also have included or incorporated therewith such variations as disclosed with regard to any or all of the other embodiments. It is therefore intended that protection granted by Letter Patent hereon be limited in breadth only by the definitions that are contained in the appended claims and any equivalents thereof.

What is claimed is:

1. A method for fabrication of a semiconductor structure, the method comprising:
   providing a substrate comprising a smooth surface, the substrate comprising a material selected from the group consisting of sapphire, silicon carbide, zinc oxide, silicon, gallium arsenide, gallium nitride, aluminum nitride and aluminum gallium nitride;
   depositing a first layer comprising a group III-V material grown onto and in contact with the smooth surface of the substrate, the first layer comprising a surface with a textured as grown topology, the surface texture resulting from the growth process; and
   depositing a second layer onto the first layer, the second layer comprising a group III-V material, wherein the first layer and the second layer comprise opposite p and n dopants, a p-n junction is formed between the first layer and the second layer, and the second layer surface replicates the texture of the first layer.

2. The method of claim 1, further including depositing one or more quantum well layers on respective barrier layers on said first layer and depositing the second layer onto a further barrier layer on the uppermost quantum well layer; wherein the quantum well layers comprise a group III-V material, the second layer comprises a group III-V material, and the quantum well layers, the barrier layers, the further barrier layer, and second layer replicate the surface texture of the first layer.

3. The method of claim 2, wherein the one or more layers having quantum wells are arranged in a plane having undulations corresponding to the surface texturing of said first layer.

4. The method of claim 1, wherein the substrate comprises a material selected from the group consisting of (0001) sapphire, (11-20) sapphire, (10-12) sapphire, (0001) silicon carbide, (0001) zinc oxide, (111) silicon, (111) gallium arsenide, (0001) gallium nitride and (0001) aluminum nitride and (0001) aluminum gallium nitride.

5. The method of claim 1, wherein the first layer is deposited by a method comprising one of halide vapor phase epitaxy, metal organic chemical vapor deposition, molecular beam epitaxy, liquid phase epitaxy, laser ablation or a combination of these methods.

6. The method of claim 1, wherein the second layer is deposited by a method comprising one of halide vapor phase epitaxy, metal organic chemical vapor deposition, molecular beam epitaxy, liquid phase epitaxy, laser ablation or a combination of these methods.

7. The method of claim 1, wherein said III-V material is a III-nitride.

8. The method of claim 7, wherein said III-nitride is gallium nitride.

9. A method for fabrication of a semiconductor device, the method comprising:
   providing a substrate, the substrate comprising a material selected from the group consisting of sapphire, silicon carbide, zinc oxide, silicon, gallium arsenide, gallium nitride, aluminum nitride and aluminum gallium nitride, wherein the substrate comprises a smooth surface;
   depositing a first layer grown onto and in contact with the smooth surface of the substrate, wherein the first layer comprises a group III-V material, the first layer having an upper surface textured as grown, the surface texture resulting from the growth process;
   depositing one or more quantum well layers on respective barrier layers on said first layer, the quantum well layers comprising a group III-V material and the quantum well layers and barrier layers surface textured by the upper surface of the first layer; and
   depositing an upper layer onto a further barrier layer on the uppermost quantum well layer, the upper layer comprising a group III-V material and the upper layer and the further barrier layer textured by the uppermost quantum well layer, wherein deposition of the first layer and the upper layer includes depositing the layers with opposite p and n dopants to comprise a p-n junction therebetween.

10. The method of claim 9, wherein the substrate comprises a material selected from the group consisting of (0001) sapphire, (11-20) sapphire, (10-12) sapphire, (0001) silicon carbide, (0001) zinc oxide, (111) silicon, (111) gallium arsenide, (0001) gallium nitride and (0001) aluminum nitride and (0001) aluminum gallium nitride.

11. The method of claim 9, wherein the first layer is deposited by a method comprising one of halide vapor phase epitaxy, metal organic chemical vapor deposition, molecular beam epitaxy, liquid phase epitaxy, laser ablation or a combination of these methods.

12. The method of claim 9, wherein the quantum wells are deposited by a method comprising one of halide vapor phase epitaxy, metal organic chemical vapor deposition, molecular beam epitaxy, liquid phase epitaxy, laser ablation or a combination of these methods.

13. The method of claim 9, wherein the upper layer is deposited by a method comprising one of halide vapor phase epitaxy, metal organic chemical vapor deposition, molecular beam epitaxy, liquid phase epitaxy, laser ablation or a combination of these methods.

14. The method of claim 9, wherein said III-V material is a III-nitride.

15. The method of claim 14, wherein said III-nitride is gallium nitride.

16. The method of claim 9, wherein said one or more quantum wells comprise InGaN, or AlGaN, or a combination of both.

17. The method of claim 9, wherein the one or more layers having quantum wells are arranged in a plane having undulations corresponding to the surface texturing of said first layer.

18. A semiconductor device comprising:
- a substrate comprising a smooth surface, the substrate comprising a material selected from the group consisting of sapphire, silicon carbide, zinc oxide, silicon, gallium arsenide, gallium nitride, aluminum nitride and aluminum gallium nitride;
- a first layer comprising a group III-V material, the first layer grown onto and contacting the smooth surface of the substrate;
- one or more quantum well layers on respective barrier layers on said first layer, the quantum well layers and barrier layers each comprising a group III-V material; and
- an upper layer comprising a group III-V material, the upper layer overlaying a further barrier layer on the uppermost quantum well layer, and the first layer and the upper layer having opposite p and n dopants to form a p-n junction between the first layer and the upper layer; and wherein the first layer is textured as grown, the texture resulting from the growth process, and surfaces of the one or more quantum well layers, the barrier layers, the further barrier layer, and the upper layer replicate the texturing of the first layer.

19. The semiconductor device of claim 18, wherein the substrate comprises a material selected from the group consisting of (0001) sapphire, (11-20) sapphire, (0001) silicon carbide, (0001) zinc oxide, (111) silicon, (111) gallium arsenide, (0001) gallium nitride and (0001) aluminum nitride and (0001) aluminum gallium nitride.

20. The semiconductor device of claim 18, wherein the textured surface of said first layer has a reflectivity of less than 1% over 325 nm to 700 nm.

21. The semiconductor device of claim 18, wherein the photoluminescence of the textured surface of said first layer is more than 50-fold higher than the photoluminescence of an untextured surface of the same material.

22. The semiconductor device of claim 18, wherein the textured surface of said first layer is characterized by a Gaussian distribution of surface topology.

23. The semiconductor device of claim 18, wherein the textured surface of said first layer is characterized by an average peak to valley height of 1.3 microns.

24. The semiconductor device of claim 18, wherein the entire surface of said first layer covered by said one or more quantum wells is textured.

25. The semiconductor device of claim 18, wherein the first layer comprises gallium nitride.

26. The semiconductor device of claim 18, wherein said group III-V material is a III-nitride.

27. The semiconductor device of claim 18, wherein the group III-V material of said first layer and said upper layer is gallium nitride.

28. The semiconductor device of claim 18, wherein said one or more quantum wells comprise AlGaN, InGaN, or a combination of both.

29. The semiconductor device of claim 18, wherein the device is a light emitting diode, a solar cell, or a photosensor.

30. The semiconductor device of claim 18, wherein the light extraction efficiency of the device is greater than 99%.

31. The semiconductor device of claim 18, wherein the internal quantum efficiency of the device is at least two times higher compared with the device having a smooth first layer.

32. The semiconductor device of claim 31 having an internal quantum efficiency in the range of 50% to 60%.

33. The method of claim 18, wherein the one or more layers having quantum wells are arranged in a plane having undulations corresponding to the surface texturing of said first layer.

34. A semiconductor device comprising:
- a substrate comprising a smooth surface, the substrate comprising a material selected from the group consisting of sapphire, silicon carbide, zinc oxide, silicon, gallium arsenide, gallium nitride, aluminum nitride and aluminum gallium nitride;
- a first layer comprising a group III-V material, the first layer grown onto and contacting the smooth surface of the substrate;
- one or more quantum well layers on respective barrier layers on said first layer, the quantum well layers and barrier layers each comprising a group III-V material, and the one or more quantum well layers and barrier layers overlaying the first layer; and
- an upper layer comprising a group III-V material, the upper layer overlaying a further barrier layer on the uppermost quantum well layer, and the first layer and the upper layer having opposite p and n dopants to form a p-n junction between the first layer and the upper layer; and wherein the first layer is textured as grown, the texture resulting from the growth process, and the one or more quantum well layers, the barrier layers, the further barrier layer, and the upper layer replicate the surface texturing of the first layer;
wherein the first layer is deposited by a method comprising one of halide vapor phase epitaxy, metal organic chemical vapor deposition, molecular beam epitaxy, liquid phase epitaxy, laser ablation or a combination of these methods.

35. The semiconductor device of claim 34, wherein the first layer is deposited by a method comprising halide vapor phase epitaxy of a group III-V material.

36. The method of claim 34, wherein the one or more layers having quantum wells are arranged in a plane having undulations corresponding to the surface texturing of said first layer.

37. A semiconductor device comprising:
- a substrate comprising a smooth surface, the substrate comprising a material selected from the group consisting of sapphire, silicon carbide, zinc oxide, silicon, gallium arsenide, gallium nitride, aluminum nitride and aluminum gallium nitride;
- a first layer comprising a group III-V material, the first layer grown onto and contacting the smooth surface of the substrate;
- one or more quantum well layers on respective barrier layers the quantum well layers and barrier layers each comprising a group III-V material, and the one or more quantum well layers and barrier layers overlaying the first layer; and
- an upper layer comprising a group III-V material, the upper layer overlaying a further barrier layer on the uppermost quantum well layer, and the first layer and the upper layer having opposite p and n dopants to form a p-n junction between the first layer and the upper layer; and wherein the first layer surface is textured as grown, the texture resulting from the growth process, and the one or more quantum wells, the barrier layers, the further barrier layer, and the upper layer replicate the texturing of the first layer;

wherein said one or more quantum well layers, barrier layers, and further barrier layer are deposited by a method comprising one of halide vapor phase epitaxy, metal organic chemical vapor deposition, molecular beam epitaxy, liquid phase epitaxy, laser ablation or a combination of these methods.

38. The method of claim 37, wherein the one or more layers having quantum wells are arranged in a plane having undulations corresponding to the surface texturing of said first layer.

39. A semiconductor structure comprising a substrate comprising a smooth surface, the substrate comprising a material selected from the group consisting of sapphire, silicon carbide, zinc oxide, silicon, gallium arsenide, gallium nitride and aluminum nitride aluminum gallium nitride;
   a first layer comprising a group III-V material, the first layer grown onto and contacting the smooth surface of the substrate; wherein the first layer is textured as grown, the texture resulting from the growth process; and
   a second layer overlaying the first layer, the second layer comprising a group III-V material; wherein the first layer and the second layer have opposite p and n dopants to form a p-n junction between the first layer and the second layer, and the second layer replicates the surface texturing of the first layer.

40. The semiconductor structure of claim 39, wherein the structure is a light emitting diode, a solar cell, or a photosensor.

41. A method for fabrication of a semiconductor structure, the method comprising
   providing a substrate comprising a smooth surface, the substrate comprising a material selected from the group consisting of sapphire, silicon carbide, zinc oxide, silicon, gallium arsenide, gallium nitride, aluminum nitride and aluminum gallium nitride;
   depositing a non-single crystalline buffer layer comprising gallium nitride grown onto and in contact with the smooth surface of the substrate; and
   depositing a first layer comprising a group III-nitride material onto the buffer layer, the first layer comprising a surface with a textured as grown topology, the surface texture resulting from the growth process; and
   depositing a second layer onto the first layer, the second layer comprising a group III-V material, wherein the first layer and the second layer comprise opposite p and n dopants, a p-n junction is formed between the first layer and the second layer, and the second layer replicates the texture of the first layer.

42. A method for fabrication of a semiconductor structure, the method including
   providing a substrate comprising a smooth surface, the substrate comprising a material selected from the group consisting of sapphire, silicon carbide, zinc oxide, silicon, gallium arsenide, gallium nitride, aluminum nitride and aluminum gallium nitride;
   depositing a non-single crystalline buffer layer comprising gallium nitride grown onto and in contact with the smooth surface of the substrate; and
   depositing a first layer comprising a group III-nitride material grown onto and in contact with the buffer layer, the first layer comprising a surface with a textured as grown topology, the surface texture resulting from the growth process; and
   depositing one or more quantum well layers on respective barrier layers on said first layer and depositing an upper layer onto a further barrier layer on the uppermost quantum well; wherein the quantum wells comprise a group III-V material, the upper layer comprises a group III-V material, and the quantum well layers, barrier layers, further barrier layer, and upper layer replicate the texture of the first layer.

43. The method of claim 42, wherein the one or more layers having quantum wells are arranged in a plane having undulations corresponding to the surface texturing of said first layer.

44. A method for fabrication of a semiconductor device, the method comprising:
   providing a substrate, the substrate comprising a material selected from the group consisting of sapphire, silicon carbide, zinc oxide, silicon, gallium arsenide, gallium nitride, aluminum nitride and aluminum gallium nitride, wherein the substrate comprises a smooth surface;
   depositing a non-single crystalline buffer layer comprising gallium nitride grown onto and in contact with the smooth surface of the substrate;
   depositing a first layer grown onto and in contact with the buffer layer, wherein the first layer comprises a group III-nitride material, the first layer having an upper surface textured as grown, the surface texture resulting from the growth process;
   depositing one or more quantum well layers on respective barrier layers on said first layer, the quantum well layers and barrier layers comprising a group III-V material and textured by the upper surface of the first layer; and
   depositing an upper layer onto a further barrier layer on the uppermost quantum well layer, the upper layer comprising a group III-V material and the upper layer and further barrier layer textured by the uppermost quantum well, wherein deposition of the first layer and the upper layer includes depositing the layers with opposite p and n dopants to comprise a p-n junction therebetween.

45. The method of claim 44, wherein said III-V material is a III-nitride.

46. The method of claim 45, wherein said III-nitride is gallium nitride.

47. The method of claim 44, wherein said one or more quantum well layers comprise InGaN, or AlGaN, or a combination of both.

48. The method of claim 44, wherein the one or more layers having quantum wells are arranged in a plane having undulations corresponding to the surface texturing of said first layer.

49. A semiconductor device comprising:
   a substrate comprising a smooth surface, the substrate comprising a material selected from the group consisting of sapphire, silicon carbide, zinc oxide, silicon, gallium arsenide, gallium nitride, aluminum nitride and aluminum gallium nitride;
   a non-single crystalline buffer layer comprising gallium nitride, the buffer layer grown onto and contacting the smooth surface of the substrate;
   a first layer comprising a group III-nitride material, the first layer grown onto and contacting the buffer layer;
   one or more quantum well layers on respective barrier layers on said first layer, the quantum well layers and barrier layers each comprising a group III-V material; and
   an upper layer comprising a group III-V material, the upper layer overlaying a further barrier layer on the uppermost quantum well layer, and the first layer and the upper layer having opposite p and n dopants to form a p-n junction between the first layer and the upper layer; and wherein the first layer is textured as grown, the texture resulting from the growth process, and surfaces of the one or more quantum well layers, the barrier layers, the further barrier layer, and the upper layer replicate the surface texturing of the first layer.

50. The semiconductor device of claim 49, wherein the substrate comprises a material selected from the group consisting of (0001) sapphire, (11-20) sapphire, (0001) silicon carbide, (0001) zinc oxide, (111) silicon, (111) gallium arsenide, (0001) gallium nitride and (0001) aluminum nitride and (0001) aluminum gallium nitride.

51. The semiconductor device of claim 49, wherein the textured surface of said first layer has a reflectivity of less than 1% over 325 nm to 700 nm.

52. The semiconductor device of claim 49, wherein the photoluminescence of the textured surface of said first layer is more than 50-fold higher than the photoluminescence of an untextured surface of the same material.

53. The semiconductor device of claim 49, wherein the textured surface of said first layer is characterized by a Gaussian distribution of surface topology.

54. The semiconductor device of claim 49, wherein the textured surface of said first layer is characterized by an average peak to valley height of 1.3 microns.

55. The semiconductor device of claim 49, wherein the entire surface of said first layer covered by said one or more quantum wells is textured.

56. The semiconductor device of claim 49, wherein the first layer comprises gallium nitride.

57. The semiconductor device of claim 56, wherein the substrate is sapphire and the sapphire has been subjected to nitridation.

58. The semiconductor device of claim 49, wherein said group III-V material is a III-nitride.

59. The semiconductor device of claim 49, wherein the group III-nitride material of said first layer and the group III-V material of said upper layer are both gallium nitride.

60. The semiconductor device of claim 49, wherein said one or more quantum wells comprise AlGaN, InGaN, or a combination of both.

61. The semiconductor device of claim 49, wherein the device is a light emitting diode, a solar cell, or a photosensor.

62. The semiconductor device of claim 49, wherein the light extraction efficiency of the device is greater than 99%.

63. The semiconductor device of claim 49, wherein the internal quantum efficiency of the device is at least two times higher compared with the device having a smooth first layer.

64. The semiconductor device of claim 63 having an internal quantum efficiency in the range of 50% to 60%.

65. The method of claim 49, wherein the one or more layers having quantum wells are arranged in a plane having undulations corresponding to the surface texturing of said first layer.

66. A semiconductor device comprising:
a substrate comprising a smooth surface, the substrate comprising a material selected from the group consisting of sapphire, silicon carbide, zinc oxide, silicon, gallium arsenide, gallium nitride, aluminum nitride and aluminum gallium nitride;
a non-single crystalline buffer layer comprising gallium nitride, the buffer layer grown onto and contacting the smooth surface of the substrate;
a first layer comprising a group III-nitride material, the first layer grown onto and contacting the buffer layer;
one or more quantum well layers on respective barrier layers on said first layer, the quantum well layers and barrier layers each comprising a group III-V material; and
an upper layer comprising a group III-V material, the upper layer overlaying a further barrier layer on the uppermost quantum well layer, and the first layer and the upper layer having opposite p and n dopants to form a p-n junction between the first layer and the upper layer; and wherein the first layer is textured as grown, the texture resulting from the growth process, and surfaces of the one or more quantum well layers, the barrier layers, the further barrier layer, and the upper layer replicate the surface texturing of the first layer
wherein the first layer is deposited by a method comprising one of halide vapor phase epitaxy, metal organic chemical vapor deposition, molecular beam epitaxy, liquid phase epitaxy, laser ablation or a combination of these methods.

67. The semiconductor device of claim 66, wherein the first layer is deposited by a method comprising halide vapor phase epitaxy of a group III-nitride material.

68. The method of claim 66, wherein the one or more layers having quantum wells are arranged in a plane having undulations corresponding to the surface texturing of said first layer.

69. A semiconductor device comprising:
a substrate comprising a smooth surface, the substrate comprising a material selected from the group consisting of sapphire, silicon carbide, zinc oxide, silicon, gallium arsenide, gallium nitride, aluminum nitride and aluminum gallium nitride;
a non-single crystalline buffer layer comprising gallium nitride, the buffer layer grown onto and contacting the smooth surface of the substrate;
a first layer comprising a group III-nitride material, the first layer grown onto and contacting the buffer layer;
one or more quantum well layers on respective barrier layers on said first layer, the quantum well layers and barrier layers each comprising a group III-V material; and
an upper layer comprising a group III-V material, the upper layer overlaying a further barrier layer on the uppermost quantum well layer, and the first layer and the upper layer having opposite p and n dopants to form a p-n junction between the first layer and the upper layer; and wherein the first layer is textured as grown, the texture resulting from the growth process, and surfaces of the one or more quantum well layers, the barrier layers, the further barrier layer, and the upper layer replicate the surface texturing of the first layer
wherein said one or more quantum well layers, barrier layers, and further barrier layer are deposited by a method comprising one of halide vapor phase epitaxy, metal organic chemical vapor deposition, molecular beam epitaxy, liquid phase epitaxy, laser ablation or a combination of these methods.

70. The method of claim 69, wherein the one or more layers having quantum wells are arranged in a plane having undulations corresponding to the surface texturing of said first layer.

71. A semiconductor structure comprising
a substrate comprising a smooth surface, the substrate comprising a material selected from the group consisting of sapphire, silicon carbide, zinc oxide, silicon, gallium arsenide, gallium nitride, aluminum nitride and aluminum gallium nitride;
a non-single crystalline buffer layer comprising gallium nitride, the buffer layer grown onto and contacting the smooth surface of the substrate;
a first layer comprising a group III-nitride material, the first layer grown onto and contacting the buffer layer;

wherein the first layer is textured as grown, the texture resulting from the growth process; and a second layer overlaying the first layer, the second layer comprising a group III-V material; wherein the first layer and the second layer have opposite p and n dopants to form a p-n junction between the first layer and the second layer, and the second layer replicates the texturing of the first layer.

72. The semiconductor structure of claim 71, wherein the structure is a light emitting diode, a solar cell, or a photosensor.

* * * * *

UNITED STATES PATENT AND TRADEMARK OFFICE
CERTIFICATE OF CORRECTION

| | | |
|---|---|---|
| PATENT NO. | : 7,777,241 B2 | Page 1 of 1 |
| APPLICATION NO. | : 11/107150 | |
| DATED | : August 17, 2010 | |
| INVENTOR(S) | : Theodore D. Moustakas et al. | |

It is certified that error appears in the above-identified patent and that said Letters Patent is hereby corrected as shown below:

Column 5, line 38 "10 nm" should read -- 10 μm --.

Signed and Sealed this
Twenty-fourth Day of April, 2012

David J. Kappos
*Director of the United States Patent and Trademark Office*